US010713128B2

(12) United States Patent
Nguyen et al.

(10) Patent No.: US 10,713,128 B2
(45) Date of Patent: Jul. 14, 2020

(54) ERROR RECOVERY IN VOLATILE MEMORY REGIONS

(71) Applicant: Microsoft Technology Licensing, LLC, Redmond, WA (US)

(72) Inventors: Tom L. Nguyen, Auburn, NY (US); Mallik Bulusu, Bellevue, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 218 days.

(21) Appl. No.: 15/828,138

(22) Filed: Nov. 30, 2017

(65) Prior Publication Data

US 2019/0163557 A1   May 30, 2019

(51) Int. Cl.
*G06F 11/20* (2006.01)
*G06F 11/10* (2006.01)
*G11C 29/04* (2006.01)
*G06F 11/16* (2006.01)
*G06F 12/16* (2006.01)
*G11C 29/44* (2006.01)
*G11C 29/00* (2006.01)

(52) U.S. Cl.
CPC ...... *G06F 11/2017* (2013.01); *G06F 11/1016* (2013.01); *G06F 11/1666* (2013.01); *G06F 12/16* (2013.01); *G11C 29/04* (2013.01); *G11C 29/4401* (2013.01); *G11C 29/883* (2013.01); *G11C 2029/0409* (2013.01)

(58) Field of Classification Search
CPC .... G06F 11/142; G06F 11/1435; G06F 11/16; G06F 11/1658; G06F 11/1666; G06F 11/20; G06F 11/2017; G06F 11/3037; G06F 3/0614; G06F 3/0619; G06F 12/16; G11C 2029/4049; G11C 2029/4011; G11C 29/52; G11C 29/70; G11C 29/76; G11C 29/88; G11C 29/883
See application file for complete search history.

(56) References Cited

U.S. PATENT DOCUMENTS

| | | | | |
|---|---|---|---|---|
| 4,819,154 A * | 4/1989 | Stiffler | ................ | G06F 11/1435 711/E12.04 |
| 5,477,492 A * | 12/1995 | Ohsaki | ................... | G11C 29/70 365/200 |
| 6,993,690 B1 * | 1/2006 | Okamoto | ............... | G11C 16/20 365/185.33 |
| 7,302,526 B1 * | 11/2007 | Cartmell | ............ | G06F 11/1658 711/120 |

(Continued)

*Primary Examiner* — Gabriel Chu
(74) *Attorney, Agent, or Firm* — Mannava & Kang, P.C.

(57) ABSTRACT

In some examples, error recovery in volatile memory regions may include determining, during a save operation that includes saving of data to a primary location, that an error occurred with respect to the save operation. Based on a determination that the error occurred with respect to the save operation, an error location may be determined, and a determination may be made as to whether the error location maps to a volatile memory region. Based on a determination that the error location maps to the volatile memory region, a reserved location may be identified for saving the data. The data may be saved from the primary location to the reserved location. Further, metadata may be updated to indicate usage of the reserved location as the primary location for the saved data.

18 Claims, 6 Drawing Sheets

(56) References Cited

U.S. PATENT DOCUMENTS

| | | | |
|---|---|---|---|
| 8,161,334 B1 * | 4/2012 | Hulbert | G11C 29/76 714/723 |
| 8,412,985 B1 * | 4/2013 | Bowers | G06F 11/1666 714/42 |
| 2004/0034809 A1 * | 2/2004 | Versen | G06F 11/1666 714/6.12 |

* cited by examiner

```
┌─────────────────────────────────────────────────────┐
│ DETERMINE, DURING A SAVE OPERATION THAT INCLUDES    │
│ SAVING OF NON-VOLATILE DUAL IN-LINE MEMORY MODULE-  │
│ SOFTWARE (NVDIMM-SW) CONTENT TO A PRIMARY LOCATION, │
│ THAT AN ERROR OCCURRED WITH RESPECT TO THE SAVE     │
│ OPERATION                                           │
│ 502                                                 │
└─────────────────────────────────────────────────────┘
                          ▼
┌─────────────────────────────────────────────────────┐
│ BASED ON A DETERMINATION THAT THE ERROR OCCURRED    │
│ WITH RESPECT TO THE SAVE OPERATION, DETERMINE AN    │
│ ERROR LOCATION, DETERMINING WHETHER THE ERROR       │
│ LOCATION MAPS TO A VOLATILE MEMORY REGION, AND      │
│ BASED ON A DETERMINATION THAT THE ERROR LOCATION    │
│ MAPS TO THE VOLATILE MEMORY REGION, IDENTIFY A      │
│ RESERVED LOCATION FOR SAVING THE NVDIMM-SW CONTENT  │
│ 504                                                 │
└─────────────────────────────────────────────────────┘
                          ▼
┌─────────────────────────────────────────────────────┐
│ SAVE THE NVDIMM-SW CONTENT FROM THE PRIMARY         │
│ LOCATION TO THE RESERVED LOCATION                   │
│ 506                                                 │
└─────────────────────────────────────────────────────┘
                          ▼
┌─────────────────────────────────────────────────────┐
│ UPDATE METADATA TO INDICATE USAGE OF THE RESERVED   │
│ LOCATION AS THE PRIMARY LOCATION FOR THE SAVED      │
│ NVDIMM-SW CONTENT                                   │
│ 508                                                 │
└─────────────────────────────────────────────────────┘
```

ERROR RECOVERY IN VOLATILE MEMORY REGIONS

BACKGROUND

In a computer system, volatile memory is computer storage that maintains its data while the computer system is powered on. An example of a volatile memory includes random access memory (RAM) that is used for primary storage in a computer system. Compared to volatile memory, non-volatile memory may be used for secondary storage, or persistent storage. Examples of non-volatile memory include read-only memory, flash memory, magnetic computer storage devices, etc. Another example of non-volatile memory includes a non-volatile dual in-line memory module (NVDIMM), which is a type of random-access memory that retains its data even in the event of an unanticipated loss of power, a normal computer system shutdown, or an unanticipated computer system crash.

A type of an NVDIMM includes a non-volatile dual in-line memory module-software (NVDIMM-SW). NVDIMM-SW may represent a storage class memory device in a cloud hardware. NVDIMM-SW may provide for efficient write access to storage devices by pairing double data rate fourth-generation (DDR4) DIMMs (hereinafter referred to as NVDIMM-SW DIMMs) with a non-volatile memory express (NVMe) storage partition (or a plurality of NVMe storage partitions) using firmware assistance. The NVDIMM-SW may utilize the NVDIMM-SW DIMMs as volatile memory to save data during runtime. In this regard, the NVDIMM-SW DIMMs may encounter errors or failures. In the event of such errors and failures, it is technically challenging to save the data without adversely impacting the integrity of the data during runtime. That is, in the event of such errors and failures, it is technically challenging to save the data so that the saved data matches the data that is intended to be saved, where the data that is intended to be saved may be needed during runtime.

BRIEF DESCRIPTION OF DRAWINGS

Features of the present disclosure are illustrated by way of example and not limited in the following figure(s), in which like numerals indicate like elements, in which.

DETAILED DESCRIPTION

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Apparatuses for error recovery in volatile memory regions, methods for error recovery in volatile memory regions, and non-transitory computer readable media having stored thereon machine readable instructions to provide error recovery in volatile memory regions are disclosed herein. The apparatuses, methods, and non-transitory computer readable media disclosed herein may provide for maintenance of overall integrity for data that is saved during runtime in volatile memory by over provisioning of non-volatile dual in-line memory module-software (NVDIMM-SW) DIMM regions during pre-boot, and by defining additional metadata to track the usage of such over-provisioned NVDIMM-SW DI MM regions. As and when errors are encountered that map to a NVDIMM-SW DIMM volatile memory region, a swap operation (e.g., a "hot swap" operation between a primary DIMM and a reserved DIMM as disclosed herein) may be performed by a system management interrupt (SMI) handler. The SMI handler may notify an NVDIMM firmware interface table (NFIT) structure of the swap operation via an advanced configuration and power interface (ACPI) interrupt mechanism. Further, usage of the over-provisioned NVDIMM-SW DIMM regions may be tracked by the metadata added, for example, to a system management mode (SMM) region and/or a non-volatile memory express (NVMe) metadata region.

Non-volatile memory may include a NVDIMM that is a type of random-access memory that may include a synchronous dynamic random-access memory (SDRAM) for volatile memory, a negative-AND (NAND) flash that serves as a non-volatile memory for data retention, and a NVDIMM controller for controlling data save and retrieval operations between the SDRAM and the NAND flash. For example, the NVDIMM controller may control a backup operation that includes transmission of data from the SDRAM to the NAND Flash, and a restore operation that includes retrieval of data from the NAND Flash to the SDRAM. The backup operation may be powered by a battery. During booting of a computer, the basic input output system (BIOS) may identify the NVDIMM, and perform the restore operation that includes retrieval of data from the NAND Flash to the SDRAM. The NVDIMM with the SDRAM and the NAND Flash may also be referred to as NVDIMM-N.

Compared to NVDIMM-N, non-volatile dual in-line memory module-software (NVDIMM-SW) may represent a storage class memory device in a cloud hardware. NVDIMM-SW may provide for efficient write access to storage devices by pairing double data rate fourth-generation (DDR4) DIMMs with an NVMe storage partition (or a plurality of NVMe storage partitions) using firmware assistance. For example, NVDIMM-SW may use NVMe partitions as non-volatile memory to save the NVDIMM-SW contents across cold resets or system shut downs. Further, the NVDIMM-SW may use the DIMMs (i.e., the NVDIMM-SW DIMMs) as volatile memory.

Cold resets may represent resets during which non-volatile data is preserved and the memory context in volatile memory is lost, whereas warm resets may represent resets during which memory contents are preserved across reboots.

With respect to saving of the NVDIMM-SW contents, during runtime, committed data may be transmitted directly to a dynamic random-access memory (DRAM) of the DIMM. The DRAM may be battery-backed and battery support for the DRAM may be provided by a power supply unit (PSU).

With respect to errors and failures encountered by the NVDIMM-SW DIMMs, such errors and failures may include, for example, memory correctable or uncorrectable errors. The memory correctable errors may include, for example, correctable error rates that may adversely impact integrity of saved data during runtime. The memory uncorrectable errors may include, for example, stuck bits (e.g., where "1" is written, but the bit always reads as "0" (or vise-versa)), double bit errors, etc., that may likewise adversely impact integrity of saved data during runtime. In the event of such errors and failures, it is technically challenging to save the data without adversely impacting the integrity of the data during runtime.

In order to address at least the aforementioned technical challenges with respect to saving of data, as disclosed herein, for the apparatuses, methods, and non-transitory computer readable media disclosed herein, the NVDIMM-SW DIMM regions may be over-provisioned during pre-boot. Further, additional metadata may be defined to keep track of usage of the over-provisioned NVDIMM-SW DIMM regions.

According to examples, for the apparatuses, methods, and non-transitory computer readable media disclosed herein, the over-provisioned NVDIMM-SW DIMM regions may be designated as reserved partitions that may be used for automatic recovery and/or migration of NVDIMM-SW runtime data in volatile DIMMs.

According to examples, for the apparatuses, methods, and non-transitory computer readable media disclosed herein, the metadata may be used to track the over-provisioned memory, and may be stored in system management random access memory (SMRAM) and may be used by the memory remote access service (RAS) handlers to determine the swap actions (e.g., the hot swap actions).

According to examples, the apparatuses, methods, and non-transitory computer readable media disclosed herein may provide for dynamic update of the NFIT structure, and notification of the change to the NFIT structure to the operating system (OS) via an ACPI interrupt mechanism.

For the apparatuses, methods, and non-transitory computer readable media disclosed herein, modules, as described herein, may be any combination of hardware and programming to implement the functionalities of the respective modules. In some examples described herein, the combinations of hardware and programming may be implemented in a number of different ways. For example, the programming for the modules may be processor-executable instructions stored on a non-transitory machine-readable storage medium and the hardware for the modules may include a processing resource to execute those instructions. In these examples, a computing device implementing such modules may include the machine-readable storage medium storing the instructions and the processing resource to execute the instructions, or the machine-readable storage medium may be separately stored and accessible by the computing device and the processing resource. In some examples, some modules may be implemented in circuitry.

Figure 1:
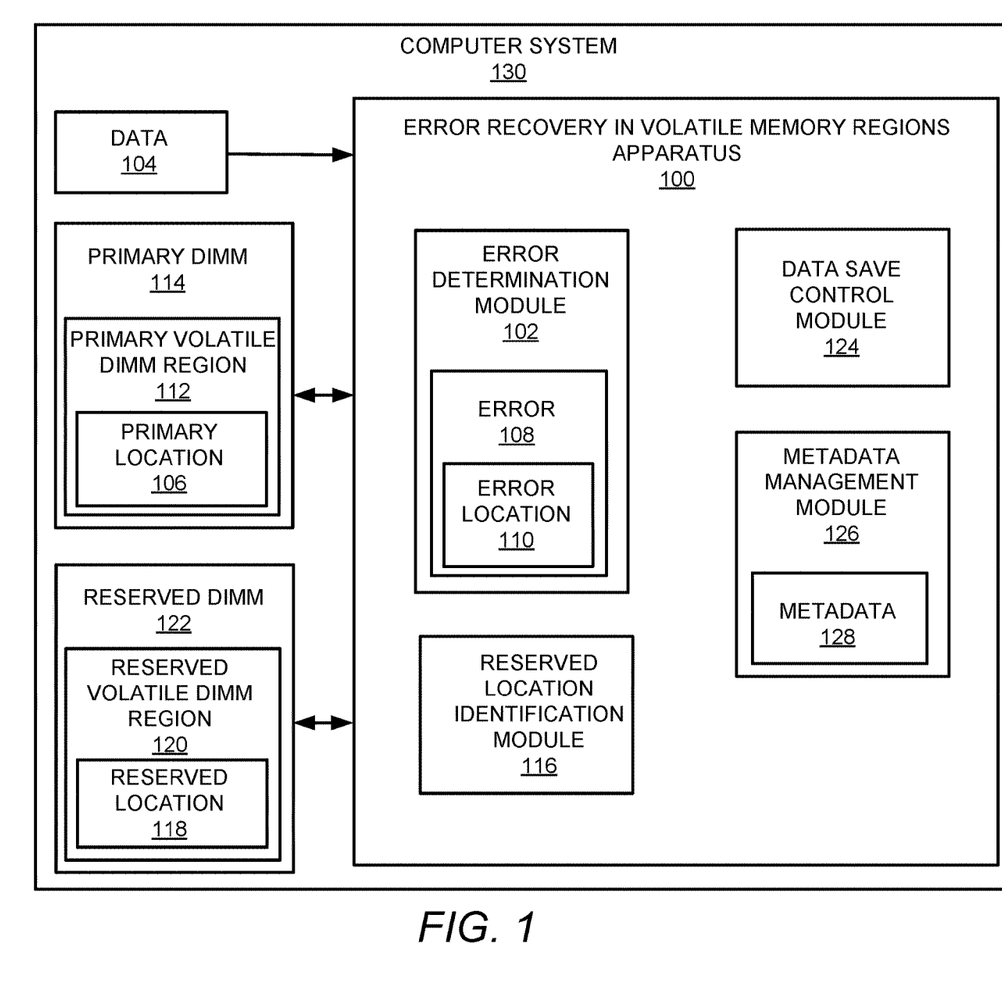
FIG. 1 illustrates a layout of an error recovery in volatile memory regions apparatus in accordance with an embodiment of the present disclosure.

FIG. 1 illustrates a layout of an apparatus for error recovery in volatile memory regions (hereinafter also referred to as "apparatus 100") according to an embodiment of the present disclosure.

Referring to FIG. 1, the apparatus 100 may include an error determination module 102 to determine, during a save operation that includes saving of data 104 to a primary location 106, that an error 108 occurred with respect to the save operation. According to examples, the data 104 may include NVDIMM-SW content.

Based on a determination that the error 108 occurred with respect to the save operation, the error determination module 102 may determine an error location 110. The error determination module 102 may determine whether the error location 110 maps to a volatile memory region. According to examples, the primary location 106 may be associated with the volatile memory region that is represented by a primary volatile DIMM region 112 that is to be used to save the NVDIMM-SW content. According to examples, the primary volatile DI MM region 112 may be implemented in a primary DIMM 114 (also referred to as primary NVDIMM-SW DIMM).

In addition, or in other examples, the error 108 may include a correctable error. In this regard, the error determination module 102 may determine, during the save operation that includes the saving of the data 104 to the primary location 106, that the correctable error occurred with respect to the save operation, and based on the determination that the correctable error occurred with respect to the save operation, the error determination module 102 may determine the error location 110 by determining, for a specified time duration and for the volatile memory region, that a number of correctable errors including the correctable error exceeds a specified threshold. Further, based on a determination, for the specified time duration and for the volatile memory region, that the number of correctable errors including the correctable error exceeds the specified threshold and based on the determination that the correctable error occurred with respect to the save operation, the error determination module 102 may determine the error location 110. The number of correctable errors may provide an indication of whether the associated DIMM is about to fail (e.g., is not performing as specified).

In addition, or in other examples, the error 108 may include a double bit error that results in operational failure of the primary DIMM 114.

In addition, or in other examples, the error 108 may include a single bit error that results in the data 104 being incorrectly saved to the primary location 106.

In addition, or in other examples, the error 108 may include an unconsumed error that represents an error on a cache line that is not being read. For example, erroneous data in a cache line may not be read (e.g., consumed) by the central processing unit (CPU).

Based on a determination that the error location 110 maps to the volatile memory region, a reserved location identification module 116 may identify a reserved location 118 for saving the data 104. According to examples, the reserved location identification module 116 may activate, based on the identification of the reserved location 118 for saving the data 104, the reserved location 118 as the primary location 106 for saving the data 104. According to examples, the reserved location 118 may be associated with a reserved volatile DIMM region 120 that is to be used to save the NVDIMM-SW content based on the determination that the error 108 occurred with respect to the save operation. According to examples, the reserved volatile DIMM region 120 may be implemented in a reserved DIMM 122 (also referred to as reserved NVDIMM-SW DIMM) that is different from the primary DIMM 114.

A data save control module 124 may save the data 104 from the primary location 106 to the reserved location 118.

A metadata management module 126 may update metadata 128 to indicate usage of the reserved location 118 as the primary location 106 for the saved data 104. In addition, or in other examples, the metadata management module 126 may update the metadata 104 to mark the primary location 106 for which the data 104 is saved to the reserved location 118 as invalid for saving of further data.

According to examples, the apparatus 100 may be implemented on a computer system 130 as shown in FIG. 1. Alternatively, the apparatus 100 may be implemented separately from the computer system 130 (e.g., on another computer system, in a cloud environment, etc.). Further, various components of the apparatus 100 that provide the control for saving data 104 from the primary DIMM 114 to the reserved DIMM 122, and for handling different types of errors as disclosed herein may be implemented in the basic input output system (BIOS) of the computer system 130.

According to examples, as disclosed herein, for the computer system 130 that includes mirroring of the DIMMs, the error determination module 102 may determine whether mirroring with respect to the save operation is enabled or disabled. Based on a determination that the mirroring is disabled, the error determination module 102 may determine, during the save operation that includes saving of data 104 to a primary location 106, that an error 108 occurred with respect to the save operation. Based on a determination that the error 108 occurred with respect to the save operation, the error determination module 102 may determine an error location 110, and determine whether the error location 110 maps to a volatile memory region. Based on a determination that the error location 110 maps to the volatile memory region, the reserved location identification module 116 may identify a reserved location 118 for saving the data 104. The data save control module 124 may save the data 104 from the primary location 106 to the reserved location 118. The metadata management module 126 may update metadata 128 to indicate usage of the reserved location 118 as the primary location 106 for the saved data 104.

In addition, or in other examples, based on a determination that the mirroring is enabled, the error determination module 102 may determine, during the save operation that includes saving of the data 104 to the primary location 106, that the error 108 occurred with respect to the save operation. Based on the determination that the error 108 occurred with respect to the save operation, the error determination module 102 may determine the error location, and determine whether the error location maps to the volatile memory region. Based on the determination that the error location maps to the volatile memory region, the reserved location identification module 116 may identify that reserved location 118 that is mirrored to the primary location 106 and includes the saved data 104. Thus, when mirroring is enabled and the data 104 is mirrored with respect to the primary location 106 (e.g., a leader location as disclosed herein) and the reserved location 118 (e.g., a follower location as disclosed herein), the data 104 may be automatically saved in the primary location 106 and the reserved location 118. Further, the metadata management module 126 may update the metadata 104 to indicate usage of the mirrored reserved location as the primary location 106 for the saved data 104.

Operation of the apparatus 100 is described in further detail with reference to FIGS. 1-3.

Figure 2:
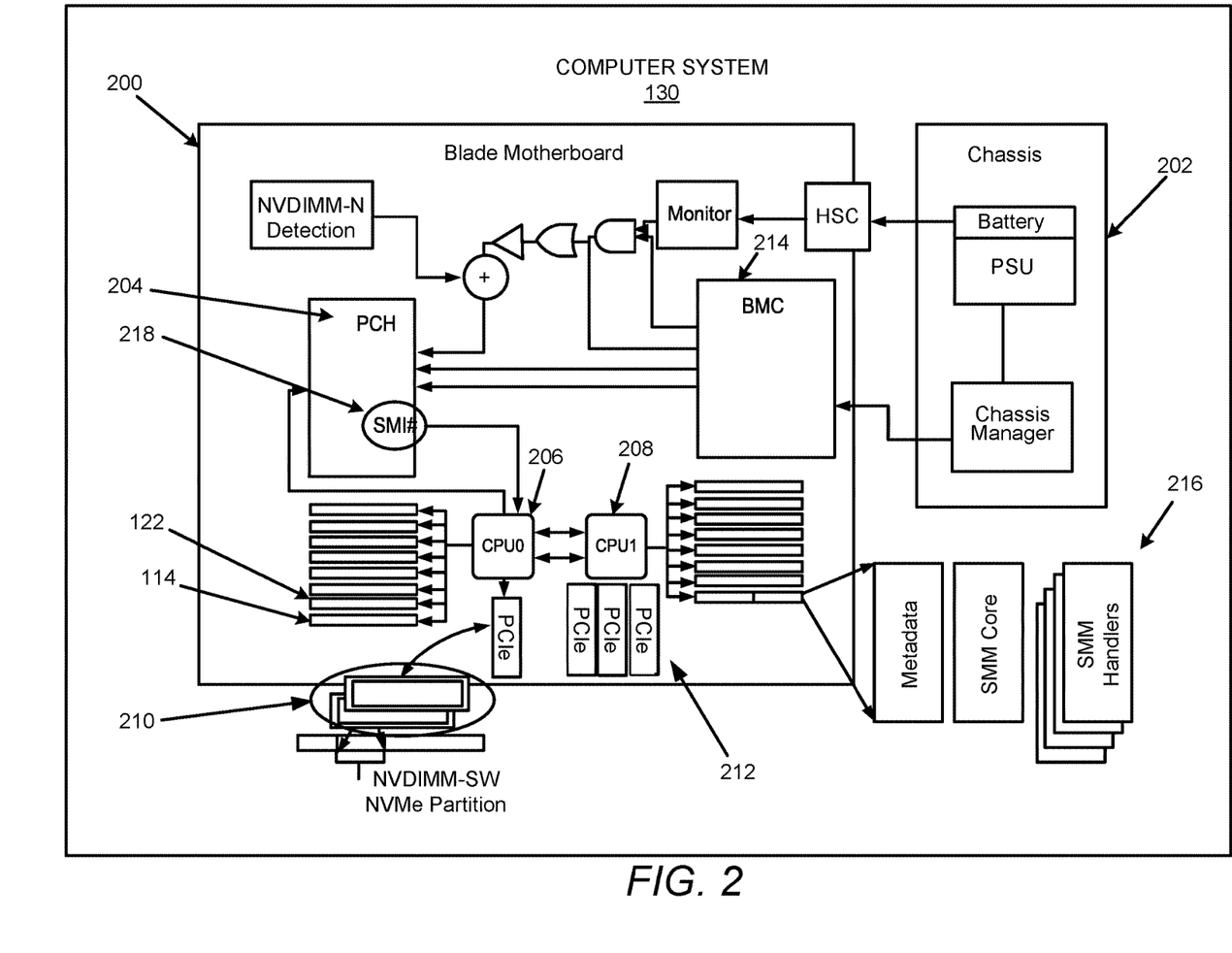
FIG. 2 illustrates an example of a layout including a double data rate fourth-generation (DDR4) non-volatile dual in-line memory module-software (NVDIMM-SW) with primary and reserved NVDIMM-SW DIMMs for the error recovery in volatile memory regions apparatus of FIG. 1 in accordance with an embodiment of the present disclosure.

FIG. 2 illustrates an example of a layout including a DDR4 NVDIMM-SW with primary and reserved NVDIMM-SW DIMMs for the apparatus 100 in accordance with an embodiment of the present disclosure.

Referring to FIGS. 1 and 2, the computer system 130 may include various other components that are omitted for facilitating a description of the apparatus 100. In this regard, a motherboard 200 and a chassis 202 of the computer system 130 are illustrated in FIG. 2.

The motherboard 200 may include a platform controller hub (PCH) 204 to control certain data paths and support functions used in conjunction with CPUs. For example, the PCH 204 may support functions used in conjunction with CPU0 at 206 and CPU1 at 208.

For the example of FIG. 2, a peripheral component interconnect express (PCIe) device 210 and further PCIe devices 212 (including three PCIe devices) may be operatively connected to one CPU or to multiple CPUs (e.g., as shown in FIG. 2). For example, the PCIe device 210 may be operatively connected to CPU0 and each further PCIe device 212 may be operatively connected to CPU1.

A baseboard management controller (BMC) at 214 may monitor the physical state of the computer system 130.

The NVDIMM-SW of FIG. 2 may include DDR4 DIMMs that include the primary DIMM 114 (or a plurality of primary DIMMs) and the reserved DIMM 122 (or a plurality of reserved DIMMs) for the volatile memory. The DDR4 DIMMs may be paired with an NVMe partition of the PCIe device 210 for non-volatile memory operations.

According to examples, the various components of the apparatus 100 that provide the control for saving data from memory (e.g., the primary DIMM 114) to storage (e.g., the NVMe partition of the PCIe device 210), or between the primary DIMM 114 and the reserved DIMM 122, and for handling different types of errors as disclosed herein may be implemented in the BIOS of the computer system 130. The BIOS for the computer system 130 may be implemented in the SMM at 216, which may be triggered through a system management interrupt (SMI) at 218.

The SMM at 216 may include the metadata 128, the SMM core, and SMM handlers. The SMM core may control the different SMM handlers with respect to saving of data, and analysis of different errors. For example, each error type may correspond to a different SMM handler with respect to saving of data.

Referring to FIGS. 1 and 2, with respect to the error 108, the error 108 may include hard errors or failures with respect to the volatile memory set aside for NVDIMM-SW. Such failures may be discovered via system management interrupts generated by underlying hardware. The hard errors may provide an indication of a performance degradation of the associated DIMM. The errors and failures may be perceived as memory correctable or uncorrectable errors. The correctable errors may include errors that can be fixed (e.g., corrected) by a memory controller, whereas the uncorrectable errors may include errors that cannot be fixed (e.g., cannot be corrected) by the memory controller. The uncorrectable errors may be encountered on a cache line. For example, even though an error may be present, the information associated with the error may not be read (e.g., since the information is loaded in a cache line). Thus the corrupted data in the cache line may be missed (e.g., poison not consumed). That is, the uncorrectable errors may not be consumed by a processor (e.g., the processor 402 of FIG. 4 and/or the processor 604 of FIG. 6). In this regard, the cloud unified extensible firmware interface (UEFI) may implement a firmware first scheme. Thus, the BIOS may be provided control first to fix errors, to thus perform any corrective actions (e.g., swapping of memory regions, etc.) with respect to the NVDIMM-SW. For example, as and when error registers (e.g., in a memory controller) are updated to reflect errors encountered on the volatile DIMMs, control may be transferred to the UEFI at runtime via system management interrupt (SMI), as disclosed with respect to FIG. 2.

As disclosed herein, the error determination module 102 may determine whether the error location 110 maps to a volatile memory region. In this regard, the SMI handler responsible for error handing may subsequently map the address corresponding to error, and determine if the address maps to the memory range set aside for NVDIMM-SW configuration. For example, the SMI handler may determine that the address corresponding to the error is 175120. From this address, the SMI handler may determine the DIMM number (e.g., DIMM-0, DIMM-1, etc.). Based on the determined DIMM number, the SMI handler may determine whether the DIMM is an NVDIMM-SW DIMM used for volatile memory. In such an event, based on the stipulated error policy (e.g., X number of correctable errors per hour, unconsumed error, double bit error, etc.), the SMI handler may mark the NVDMM-SW volatile memory region (or a "leader" mirrored DIMM of a "leader" and "follower" mirrored DIMM set as disclosed herein) as invalid. The unconsumed error may represent an error on a cache line that is not being read. For example, erroneous data in a cache line may not be read (e.g., consumed) by the CPU. The double bit error may represent an uncorrectable error (e.g., that results in a crash of the computer system 130). Further, the SMI handler may activate previously reserved memory map from alternative DIMM location(s) as NVDIMM-SW volatile memory region. Since this region is bounded by a contract with the operating system via NFIT, the system BIOS/UEFI may notify the operating system about the change to the memory map. The NFIT may provide start location, end location, size, etc., of the NVDIMM-type memory. The NFIT may include the address that is swapped during boot time. This notification may be performed, for example, via a custom ACPI system control interrupt (SCI) notification sent from the BIOS to the operating system. Upon receiving the notification, the operating system may analyze a mailbox supplied by the SMI handler where the updated NFIT is captured. The operating system may use this information to discard the older NVDIMM-SW volatile memory instance (e.g., with respect to the primary location 106), and switch to the newly allocated NVDIMM-SW volatile region (e.g., with respect to the reserved location 118).

According to examples, for the computer system 130 that supports mirroring, each DIMM for the NVDIMM-SW may include a "leader" and "follower" DIMM set. For example, assuming that the configuration of FIG. 2 includes six DIMMs, then the six DIMMs may include DIMM-0 and DIMM-1 that will have the same content, DIMM-2 and DIMM-3 that will have the same content, and DIMM-4 and DIMM-5 that will have the same content. In this regard, if an error (e.g., an uncorrectable error) is detected on one DIMM (e.g., DIMM-0) of a DIMM set (e.g., DIMM-0 and DIMM-1), then the reserved location 118 may not be needed for saving the data 104 as the data 104 already exists on the mirrored DIMM (e.g., DIMM-1). In this regard, the "follower" DIMM (e.g., DIMM-1) may be converted (e.g., swapped) to the "leader" DIMM (e.g., DIMM-0).

With respect to mirroring, the metadata 128 may include an indication of whether mirroring is enabled or disabled. If the mirroring is enabled, then the reserved location 118 may not be needed for saving the data 104 as the data 104 already exists on a mirrored DIMM. In this regard, a "follower" DIMM may be converted (e.g., swapped) to a "leader" DIMM. In addition, or in other examples, if mirroring is disabled, then, as disclosed herein, based on a determination that the error location 110 maps to the volatile memory region, the reserved location identification module 116 may identify the reserved location 118 for saving the data 104.

Figure 3:
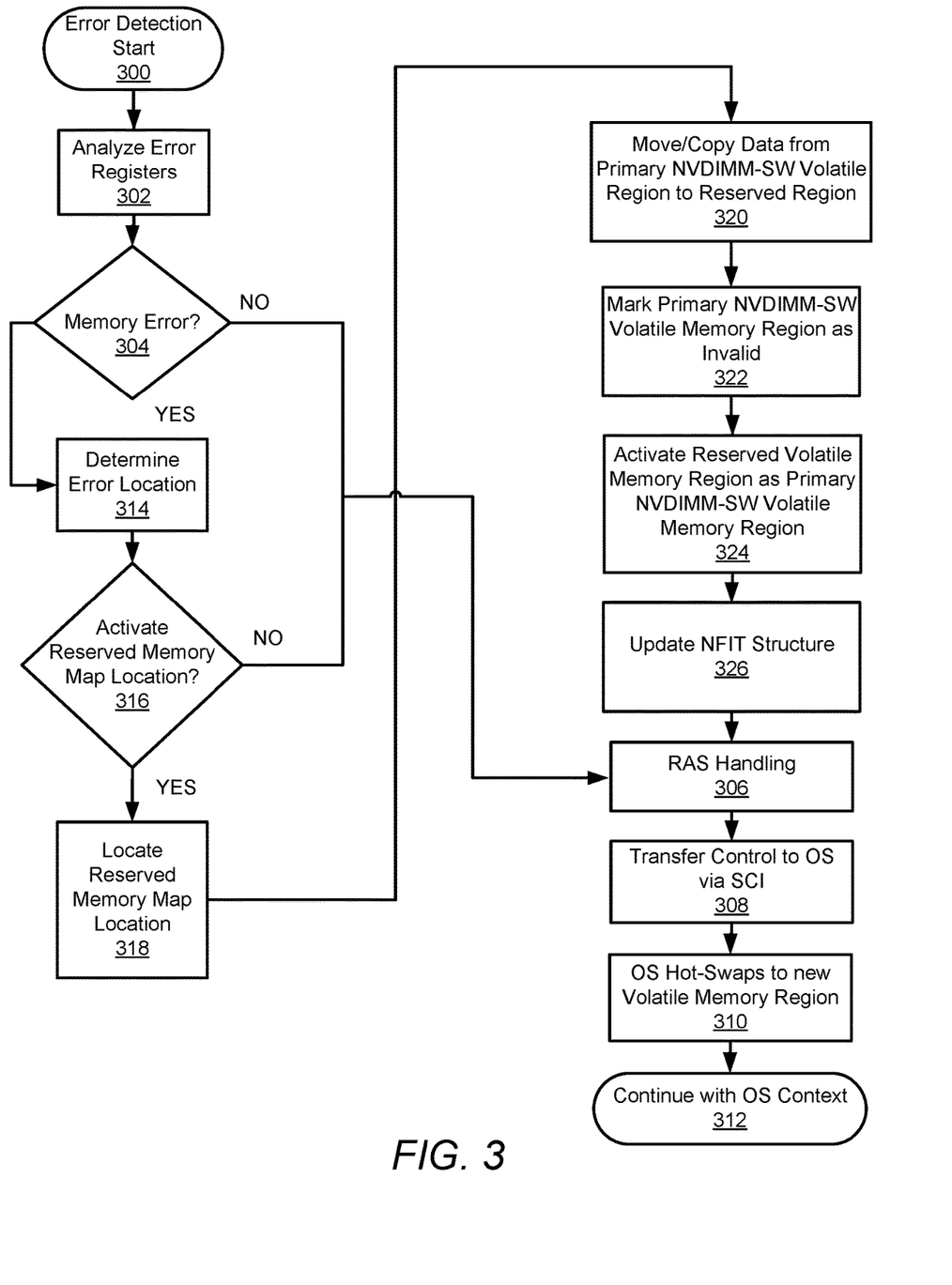
FIG. 3 illustrates an example flowchart of error detection for the error recovery in volatile memory regions apparatus of FIG. 1 in accordance with an embodiment of the present disclosure.

FIG. 3 illustrates an example flowchart of error detection for the apparatus 100 in accordance with an embodiment of the present disclosure. Some or all of the operations disclosed herein with respect to error detection may be controlled by the various modules of the apparatus 100.

Referring to FIG. 3, error detection for the computer system 130 may commence at block 300. In this regard, the error determination module 102 may determine, during a save operation that includes saving of data 104 to the primary location 106, that the error 108 occurred with respect to the save operation.

At block 302, the error determination module 102 may analyze error registers to determine, during a save operation that includes saving of data 104 to the primary location 106, that the error 108 occurred with respect to the save operation. In this regard, the functionality of the error determination module 102 may be implemented in the SMI handler to analyze the error registers.

At block 304, the error determination module 102 may determine whether the error 108 represents a memory error.

Based on a determination by the error determination module 102 that the error 108 does not represent a memory error, at block 306, remote access services (RAS) handling may be commenced. In this regard, the metadata 128 may be used to track the over-provisioned memory, and may be used by the memory RAS handlers to determine the swap actions (e.g., the hot swap actions).

At block 308, control may be transferred to the OS via SCI. For example, as disclosed herein, the system BIOS/UEFI may notify the operating system about any change to the memory map. This notification may be performed, for example, via a custom ACPI SCI notification sent from the BIOS to the operating system.

At block 310, the OS may swap (e.g., perform a "hot swap" operation) to a new volatile memory region. That is, upon receiving the notification from block 308, the operating system may analyze a mailbox supplied by the SMI handler where the updated NFIT is captured. The operating system may use this information to discard the older NVDIMM-SW volatile memory instance (e.g., with respect to the primary location 106), and switch to the newly allocated NVDIMM-SW volatile region (e.g., with respect to the reserved location 118).

At block 312, processing may continue in the same operating system context as before commencement of error detection at block 300. In this regard, the operating system may continue to utilize the data 104 as needed without any interruptions due to errors or failures resulting from saving of the data 104.

Based on a determination by the error determination module 102 that the error 108 represents a memory error, at block 314, the error determination module 102 may determine the error location 110.

At block 316, the error determination module 102 may determine whether the error location 110 maps to a volatile memory region (e.g., where the volatile memory region is represented by the primary volatile DIMM region 112 that may be used to save the NVDIMM-SW content), and further, whether to activate a reserved location for saving the data 104. With respect to activation of a reserved location for saving the data 104, in one example, the error determination module 102 may determine that a reserved location is to be activated based on an evaluation of the error. For example, for an error that includes a correctable error, the error determination module 102 may determine, for a specified time duration and for the volatile memory region, that a number of correctable errors including the correctable error exceeds a specified threshold. Further, based on a determination, for the specified time duration and for the volatile memory region, that the number of correctable errors including the correctable error exceeds the specified threshold and based on the determination that the correctable error occurred with respect to the save operation, the error determination module 102 may determine that a reserved location is to be activated.

At block 318, based on a determination that the error location 110 maps to the volatile memory region and that a reserved location is to be activated for saving the data 104, the reserved location identification module 116 may identify the reserved location 118 for saving the data 104. In this regard, the reserved location identification module 116 may locate the reserved memory map location (e.g., the reserved memory map address).

At block 320, the data save control module 124 may save the data 104 from the primary location 106 to the reserved location 118. In this regard, the data save control module 124 may move and/or otherwise copy the data 104 from a primary NVDIMM-SW volatile region to a reserved NVDIMM-SW volatile region.

At block 322, the metadata management module 126 may update the metadata 104 to mark the primary location 106 for which the data 104 is saved to the reserved location 118 as invalid for saving of further data. In this regard, the metadata management module 126 may mark the primary NVDIMM-SW volatile memory region as invalid.

At block 324, the reserved location identification module 116 may activate, based on the identification of the reserved location 118 for saving the data 104, the reserved location 118 as the primary location 106 for saving the data 104. In this regard, the reserved location identification module 116 may activate the reserved volatile memory region as the primary NVDIMM-SW volatile memory region.

At block 326, the metadata management module 126 may update metadata 128 to indicate usage of the reserved location 118 as the primary location 106 for the saved data 104. In this regard, the metadata management module 126 may update the NFIT structure.

Further processing from block 326 may proceed to blocks 306 to 312, which are previously described.

Figure 4:
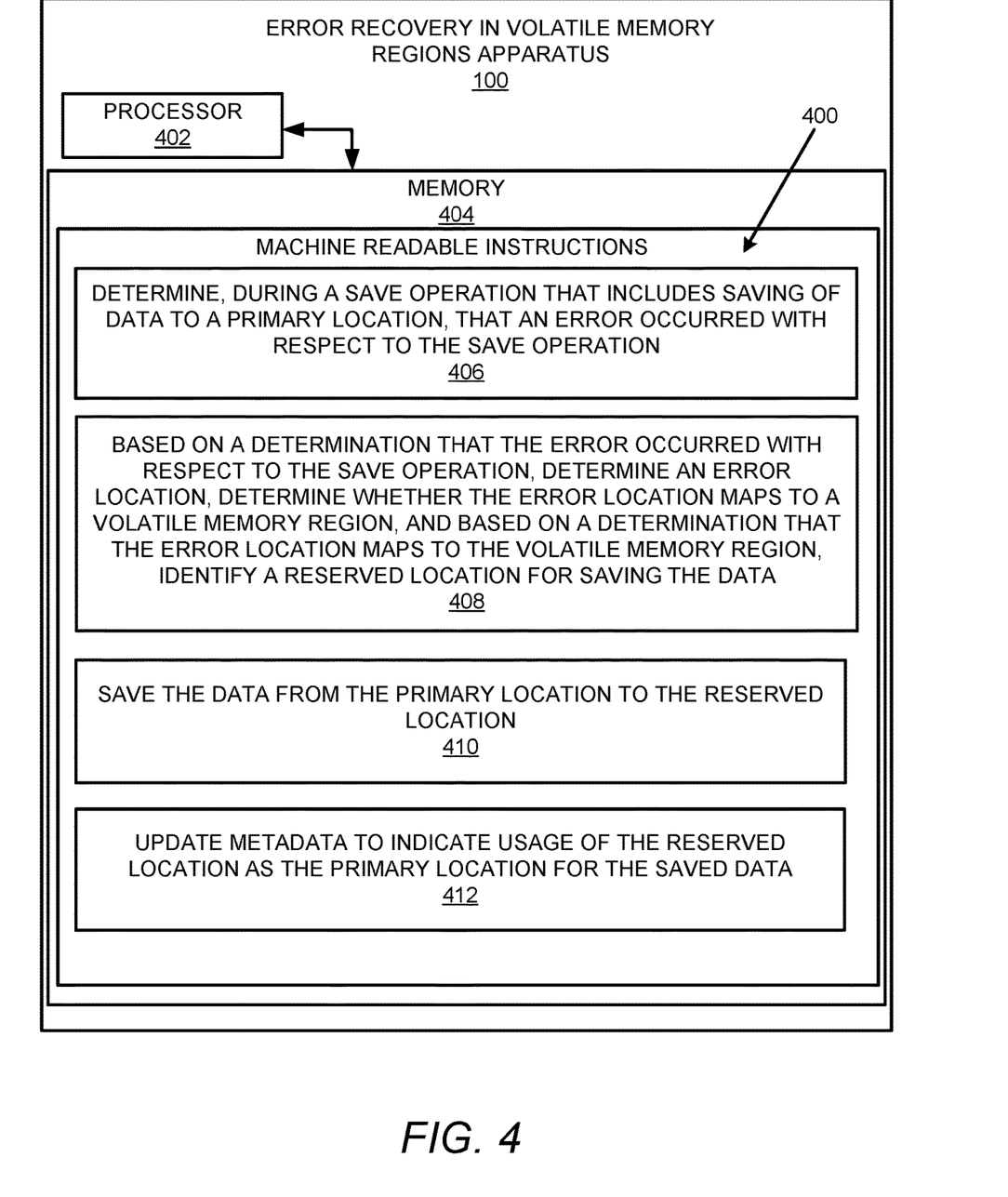
FIG. 4 illustrates a block diagram for error recovery in volatile memory regions in accordance with an embodiment of the present disclosure.
Figure 5:
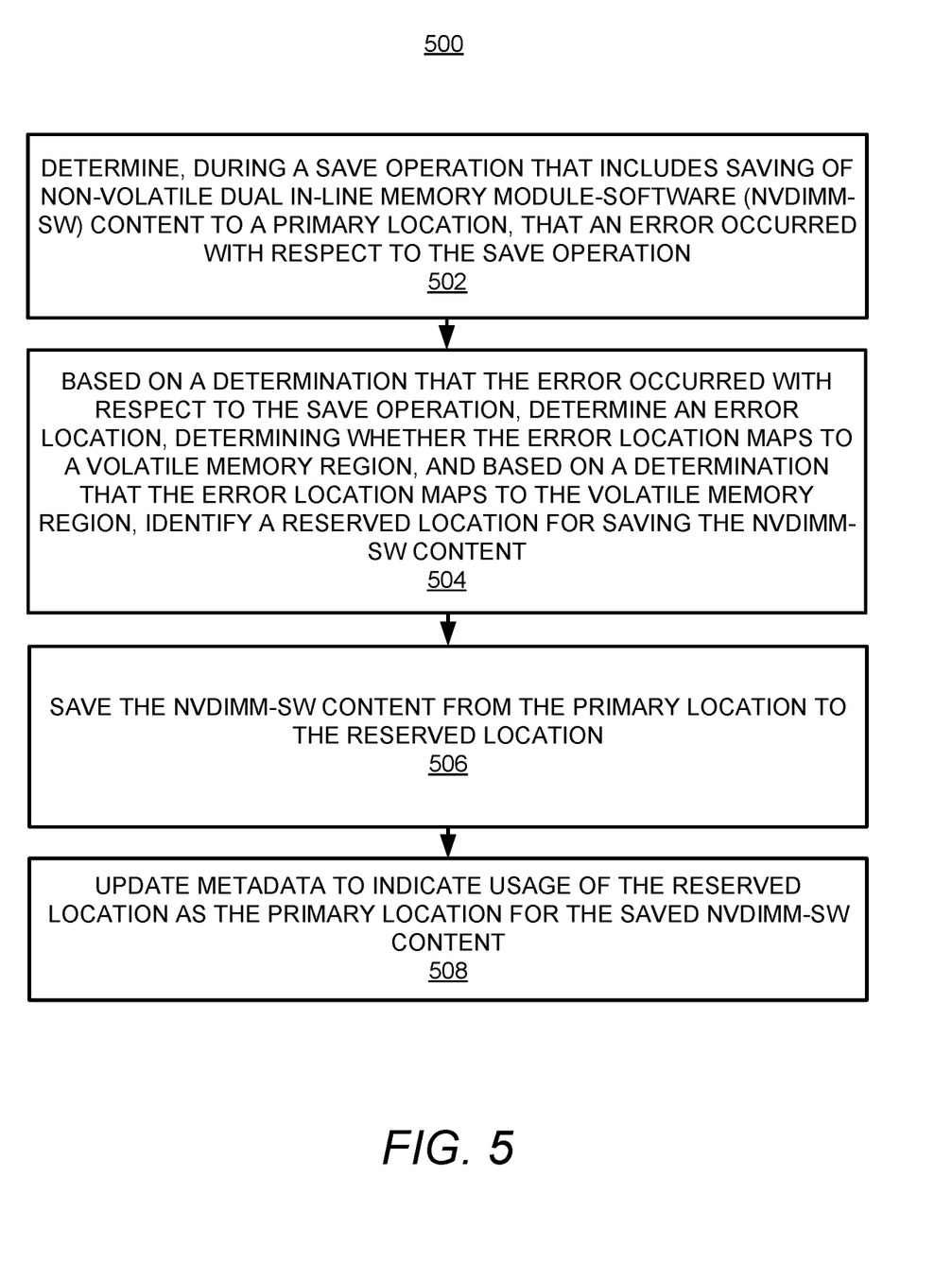
FIG. 5 illustrates a flowchart of a method for error recovery in volatile memory regions in accordance with an embodiment of the present disclosure.
Figure 6:
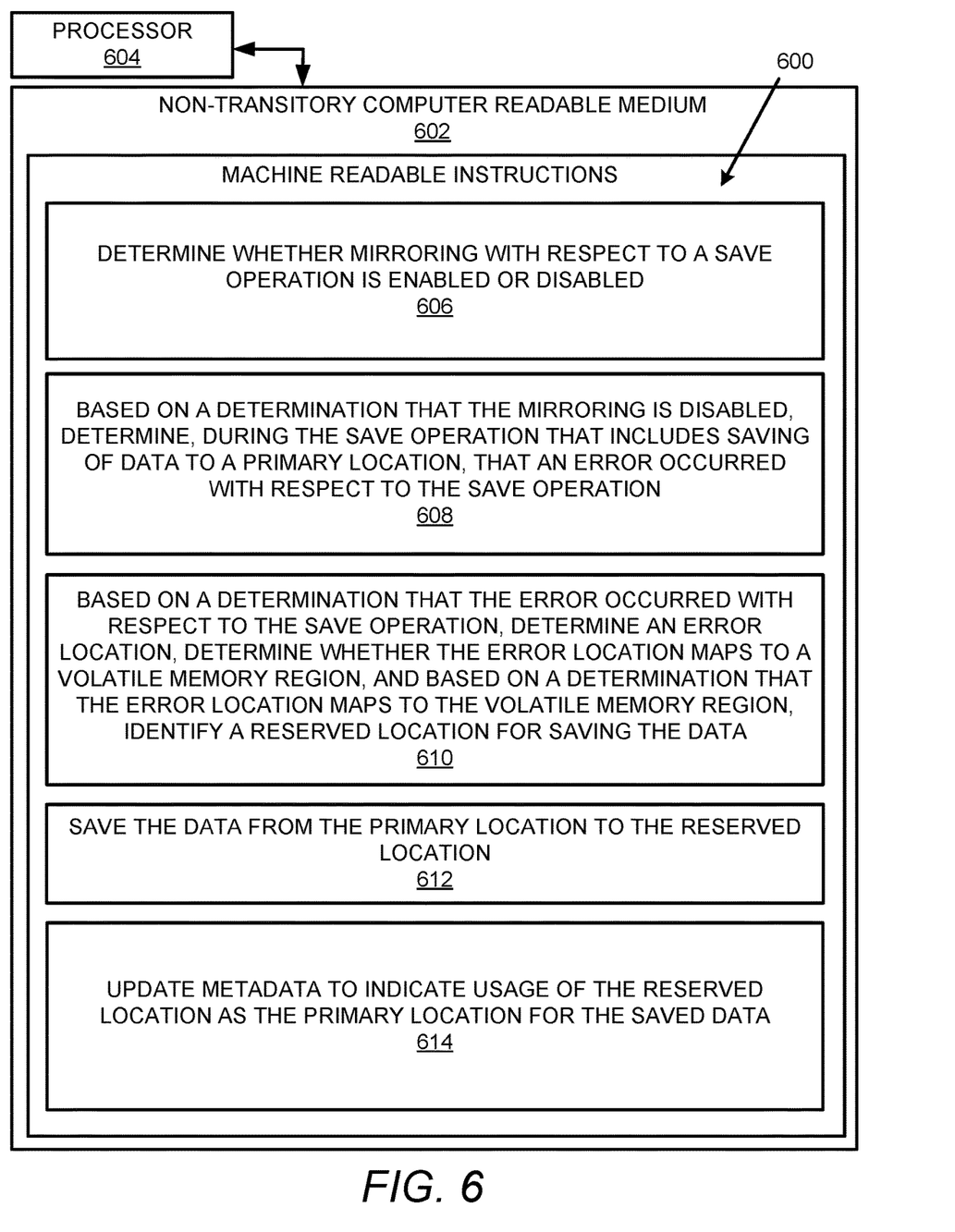
FIG. 6 illustrates a block diagram for error recovery in volatile memory regions in accordance with another embodiment of the present disclosure.

FIGS. 4-6 respectively illustrate an example block diagram 400, a flowchart of an example method 500, and a further example block diagram 600 for error recovery in volatile memory regions, according to examples. The block diagram 400, the method 500, and the block diagram 600 may be implemented on the apparatus 100 described above with reference to FIG. 1 by way of example and not of limitation. The block diagram 400, the method 500, and the block diagram 600 may be practiced in other apparatus. In addition to showing the block diagram 400, FIG. 4 shows hardware of the apparatus 100 that may execute the instructions of the block diagram 400. The hardware may include a processor 402, and a memory 404 storing machine readable instructions that when executed by the processor cause the processor to perform the instructions of the block diagram 400. The memory 404 may represent a non-transitory computer readable medium. FIG. 5 may represent an example method for error recovery in volatile memory regions, and the steps of the method. FIG. 6 may represent a non-transitory computer readable medium 602 having stored thereon machine readable instructions to provide error recovery in volatile memory regions according to an example. The machine readable instructions, when executed, cause a processor 604 to perform the instructions of the block diagram 600 also shown in FIG. 6.

The processor 402 of FIG. 4 and/or the processor 604 of FIG. 6 may include a single or multiple processors or other hardware processing circuit, to execute the methods, functions and other processes described herein. These methods, functions and other processes may be embodied as machine readable instructions stored on a computer readable medium, which may be non-transitory (e.g., the non-transitory computer readable medium 602 of FIG. 6), such as hardware storage devices (e.g., RAM (random access memory), ROM (read only memory), EPROM (erasable, programmable ROM), EEPROM (electrically erasable, programmable ROM), hard drives, and flash memory). The memory 404 may include a RAM, where the machine readable instructions and data for a processor may reside during runtime.

Referring to FIGS. 1-4, and particularly to the block diagram 400 shown in FIG. 4, the memory 404 may include instructions 406 to determine, during a save operation that includes saving of data 104 to a primary location 106, that an error 108 occurred with respect to the save operation.

Based on a determination that the error 108 occurred with respect to the save operation, the processor 402 may fetch, decode, and execute the instructions 408 to determine an error location 110, determine whether the error location 110 maps to a volatile memory region, and based on a determination that the error location 110 maps to the volatile memory region, identify a reserved location 118 for saving the data 104.

The processor 402 may fetch, decode, and execute the instructions 410 to save the data 104 from the primary location 106 to the reserved location 118.

The processor 402 may fetch, decode, and execute the instructions 412 to update metadata 128 to indicate usage of the reserved location 118 as the primary location 106 for the saved data 104.

Referring to FIGS. 1-3 and 5, and particularly FIG. 5, for the method 500, at block 502, the method may include determining, during a save operation that includes saving of NVDIMM-SW content to a primary location 106, that an error 108 occurred with respect to the save operation.

Based on a determination that the error 108 occurred with respect to the save operation, at block 504, the method may include determining an error location 110, determining whether the error location 110 maps to a volatile memory region, and based on a determination that the error location 110 maps to the volatile memory region, identifying a reserved location 118 for saving the NVDIMM-SW content.

At block 506, the method may include saving the NVDIMM-SW content from the primary location 106 to the reserved location 118.

At block 508, the method may include updating metadata 128 to indicate usage of the reserved location 118 as the primary location 106 for the saved NVDIMM-SW content.

Referring to FIGS. 1-3 and 6, and particularly FIG. 6, for the block diagram 600, the non-transitory computer readable medium 602 may include instructions 606 to determine whether mirroring with respect to a save operation is enabled or disabled.

Based on a determination that the mirroring is disabled, the processor 604 may fetch, decode, and execute the instructions 608 to determine, during the save operation that includes saving of data 104 to a primary location 106, that an error 108 occurred with respect to the save operation.

Based on a determination that the error 108 occurred with respect to the save operation, the processor 604 may fetch, decode, and execute the instructions 610 to determine an error location 110, determine whether the error location 110 maps to a volatile memory region, and based on a determination that the error location 110 maps to the volatile memory region, identify a reserved location 118 for saving the data 104.

The processor 604 may fetch, decode, and execute the instructions 612 to save the data 104 from the primary location 106 to the reserved location 118.

The processor 604 may fetch, decode, and execute the instructions 614 to update metadata 128 to indicate usage of the reserved location 118 as the primary location 106 for the saved data 104.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. An apparatus comprising:
   a processor; and
   a memory storing machine readable instructions that when executed by the processor cause the processor to:
   determine, during a save operation that includes saving of data that includes non-volatile dual in-line memory module-software (NVDIMM-SW) content to a primary location, that a correctable error occurred with respect to the save operation by determining, for a specified time duration and for a volatile memory region that is associated with the primary location and is represented by a primary volatile DIMM region that is to be used to save the NVDIMM-SW content, that a number of correctable errors including the correctable error exceeds a specified threshold;
   based on a determination, for the specified time duration and for the volatile memory region, that the number of correctable errors including the correctable error exceeds the specified threshold and based on the determination that the correctable error occurred with respect to the save operation,
   determine a correctable error location,
   determine whether the correctable error location maps to the volatile memory region, and
   based on a determination that the correctable error location maps to the volatile memory region, identify a reserved location for saving the data, wherein the reserved location is associated with a reserved volatile DIMM region that is to be used to save the NVDIMM-SW content;
   save the data from the primary location to the reserved location; and
   update metadata to indicate usage of the reserved location as the primary location for the saved data.

2. The apparatus according to claim 1, wherein the instructions are further to cause the processor to:
   implement the primary volatile DIMM region in a primary DIMM; and
   implement the reserved volatile DIMM region in a reserved DIMM that is different from the primary DIMM.

3. The apparatus according to claim 2, wherein the correctable error includes a double bit error that results in operational failure of the primary DIMM.

4. The apparatus according to claim 1, wherein the instructions are further to cause the processor to:
   update the metadata to mark the primary location for which the data is saved to the reserved location as invalid for saving of further data.

5. The apparatus according to claim 1, wherein the instructions are further to cause the processor to:
   activate, based on the identification of the reserved location for saving the data, the reserved location as the primary location for saving the data.

6. The apparatus according to claim 1, wherein the correctable error includes a single bit error that results in the data being incorrectly saved to the primary location.

7. A computer implemented method comprising:
   determining, during a save operation that includes saving of non-volatile dual in-line memory module-software (NVDIMM-SW) content to a primary location, that an error occurred with respect to the save operation;
   based on a determination that the error occurred with respect to the save operation,
   determining an error location,
   determining whether the error location maps to a volatile memory region, and
   based on a determination that the error location maps to the volatile memory region, identifying a reserved location for saving the NVDIMM-SW content;
   saving the NVDIMM-SW content from the primary location to the reserved location; and
   updating metadata to indicate usage of the reserved location as the primary location for the saved NVDIMM-SW content.

8. The method according to claim 7, wherein
   the primary location is associated with the volatile memory region that is represented by a primary volatile DIMM region that is to be used to save the NVDIMM-SW content, and
   the reserved location is associated with a reserved volatile DIMM region that is to be used to save the NVDIMM-SW content based on the determination that the error occurred with respect to the save operation.

9. The method according to claim 8, further comprising:
   implementing the primary volatile DIMM region in a primary DIMM; and
   implementing the reserved volatile DIMM region in a reserved DIMM that is different from the primary DIMM.

10. The method according to claim 9, wherein the error includes a double bit error that results in operational failure of the primary DIMM.

11. The method according to claim 7, further comprising:
updating the metadata to mark the primary location for which the NVDIMM-SW content is saved to the reserved location as invalid for saving of further NVDIMM-SW content.

12. The method according to claim 7, further comprising:
activating, based on the identification of the reserved location for saving the NVDIMM-SW content, the reserved location as the primary location for saving the NVDIMM-SW content.

13. The method according to claim 7, wherein the error includes a correctable error, and wherein determining, during the save operation that includes the saving of the NVDIMM-SW content to the primary location, that the correctable error occurred with respect to the save operation, and based on the determination that the correctable error occurred with respect to the save operation, determining the error location further comprises:
determining, for a specified time duration and for the volatile memory region, that a number of correctable errors including the correctable error exceeds a specified threshold; and
based on a determination, for the specified time duration and for the volatile memory region, that the number of correctable errors including the correctable error exceeds the specified threshold and based on the determination that the correctable error occurred with respect to the save operation, determining the error location.

14. The method according to claim 7, wherein the error includes a single bit error that results in the NVDIMM-SW content being incorrectly saved to the primary location.

15. A non-transitory computer readable medium having stored thereon machine readable instructions, the machine readable instructions, when executed by a processor, cause the processor to:
determine whether mirroring with respect to a save operation is enabled or disabled; and
based on a determination that the mirroring is disabled:
  determine, during the save operation that includes saving of data to a primary location, that an error occurred with respect to the save operation;
  based on a determination that the error occurred with respect to the save operation,
  determine an error location,
  determine whether the error location maps to a volatile memory region, and
  based on a determination that the error location maps to the volatile memory region, identify a reserved location for saving the data;
  save the data from the primary location to the reserved location; and
  update metadata to indicate usage of the reserved location as the primary location for the saved data.

16. The non-transitory computer readable medium according to claim 15, wherein
the data includes non-volatile dual in-line memory module-software (NVDIMM-SW) content,
the primary location is associated with the volatile memory region that is represented by a primary volatile DIMM region that is to be used to save the NVDIMM-SW content, and
the reserved location is associated with a reserved volatile DIMM region that is to be used to save the NVDIMM-SW content based on the determination that the error occurred with respect to the save operation.

17. The non-transitory computer readable medium according to claim 16, wherein the instructions are further to cause the processor to:
implement the primary volatile DIMM region in a primary DIMM; and
implement the reserved volatile DIMM region in a reserved DIMM that is different from the primary DIMM.

18. The non-transitory computer readable medium according to claim 15, wherein the instructions are further to cause the processor to:
based on a determination that the mirroring is enabled:
  determine, during another save operation that includes saving of other data to another primary location, that another error occurred with respect to the other save operation;
  based on a determination that the other error occurred with respect to the other save operation,
  determine another error location,
  determine whether the other error location maps to another volatile memory region, and
  based on a determination that the other error location maps to the other volatile memory region, identify another reserved location that is mirrored to the other primary location and includes other saved data; and
update other metadata to indicate usage of the mirrored reserved location as the other primary location for the other saved data of the mirrored reserved location.

* * * * *